US010381310B2

(12) United States Patent
Sundaram

(10) Patent No.: US 10,381,310 B2
(45) Date of Patent: Aug. 13, 2019

(54) EMBEDDED MULTI-DIE INTERCONNECT BRIDGE

(71) Applicant: Intel Corporation, Santa Clara, CA (US)

(72) Inventor: Arvind Sundaram, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 15/457,102

(22) Filed: Mar. 13, 2017

(65) Prior Publication Data
US 2018/0261545 A1 Sep. 13, 2018

(51) Int. Cl.
*H01L 23/538* (2006.01)
*H01L 23/00* (2006.01)
*H01L 23/498* (2006.01)
*H01L 29/778* (2006.01)
*H01L 29/20* (2006.01)

(52) U.S. Cl.
CPC .... *H01L 23/5389* (2013.01); *H01L 23/49811* (2013.01); *H01L 23/49822* (2013.01); *H01L 24/11* (2013.01); *H01L 24/16* (2013.01); *H01L 24/81* (2013.01); *H01L 29/2003* (2013.01); *H01L 29/7786* (2013.01); *H01L 2224/16153* (2013.01); *H01L 2224/16235* (2013.01); *H01L 2924/1306* (2013.01)

(58) Field of Classification Search
CPC .......... H01L 2924/13064; H01L 24/16; H01L 24/81; H01L 2224/16153; H01L 29/2003; H01L 29/7786; H01L 23/49811
See application file for complete search history.

(56) References Cited

U.S. PATENT DOCUMENTS

| 2008/0191216 A1* | 8/2008 | Machida | H01L 25/18 257/76 |
| 2013/0082241 A1* | 4/2013 | Kub | H01L 27/148 257/21 |
| 2013/0175542 A1* | 7/2013 | Briere | H01L 25/18 257/76 |

OTHER PUBLICATIONS

Deo, Manish, et al., "Enabling Next-Generation Platforms Using Intel's 3D System-in-Package Technology: Next-generation platforms increasingly require higher bandwidth, flexibility, and functionality while lowering power profiles and footprint requirements.", Intel: White Paper, (2016), 7 pgs.
Ellis, John, "GaN on silicon: A breakthrough technology for LED lighting", LEDs Magazine, Issue 67, (Feb. 13, 2014), 3 pgs.
(Continued)

*Primary Examiner* — Caridad Everhart
(74) *Attorney, Agent, or Firm* — Schwegman Lundberg & Woessner, P.A.

(57) ABSTRACT

The present disclosure relates to devices and techniques for an interconnect bridge to communicatively couple two or more dies. In an example, the interconnect bridge can include a base element having a first material. A first layer, including a second material, can be attached to the base element. A second layer, including a third material, can be disposed on the first layer. A two-dimensional electron gas (2DEG) can be located between the first layer and the second layer. A first contact, adapted to electrically couple to the first die, can be disposed in a first side of the 2DEG. A second contact, adapted to electrically couple to the second die, can be disposed in a second side of the 2DEG. Accordingly, the first die can be electrically coupled to the second die through the 2DEG.

25 Claims, 3 Drawing Sheets

(56) References Cited

OTHER PUBLICATIONS

He, Xiao-Guang, et al., "Formation of two-dimensional electron gas at AlGaN/GaN heterostructure and the derivation of its sheet density expression", Chinese Physics B, 24(6), (2015), 067301-1—067301-5.

Mahajan, Ravi, et al., "Embedded Multi-Die Interconnect Bridge (EMIB)—A High Density, High Bandwidth Packaging Interconnect", IEEE 66th Electronic Components and Technology Conference, (2016), 9 pgs.

Vetury, Ramakrishna, "Polarization Induced 2DEG in AlGaN/GaN HEMTs: On the origin, DC and transient characterization", University of California, Santa Barbara, (2000), 60 pgs.

* cited by examiner

EMBEDDED MULTI-DIE INTERCONNECT BRIDGE

TECHNICAL FIELD

This document pertains generally, but not by way of limitation, to electrical interconnections between dies, such as dies of an electronic package.

BACKGROUND

Existing interconnections between two or more dies of an integrated circuit package often include metallic conductors, such as copper traces or wires. The speed at which communication of electrical signals through such metallic conductors can be based on the electrical conductivity (or inversely the resistivity) of the conductor material. The conductivity can be effected by the size of the conductor (in length and in cross-sectional area) and the amount of electron scatter than occurs within the conductor. Electron scatter can occur when electrons traversing the conductor collide with an atom (such as an impurity) or a side wall of the conductor. Electron scatter is common in metallic conductors often used to communicate electrical signals between dies of an integrated circuit package. The electron scatter can reduce the transmission speed of electrical signals through metallic conductors, and accordingly the speed and signal integrity of signal transmission between dies of an integrated circuit package.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
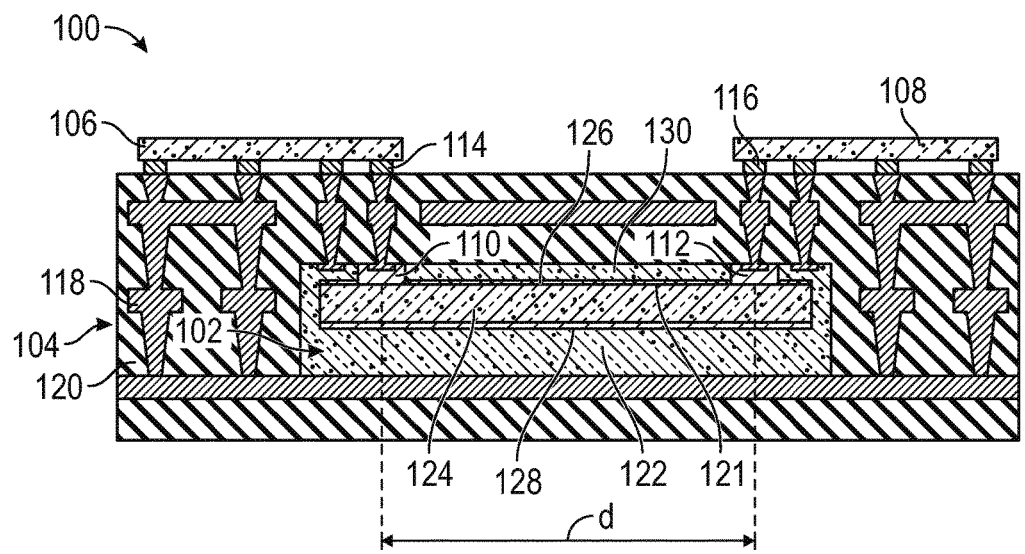
FIG. 1 illustrates an example of a cross section of an electronic package including an interconnect bridge, according to an embodiment.

The present application relates to devices and techniques for a multi-die interconnect, such as an interconnect bridge communicatively communicating between two or more dies of an electronic package through a ballistic conduction channel. The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass all available equivalents of those claims.

The present inventors have recognized, among other things, that a problem to be solved can include increasing the speed of conduction between two dies in an electronic package. Dies can be electrically coupled using a copper conductor. For instance, a copper trace or metallization layer can be disposed on a substrate. A contact of a first die can be soldered to a first end of the copper trace and a contact of a second die can be soldered to a second end of the copper trace. Accordingly, power or data signals can be communicated between the first and second dies.

However, the scattering mode of conduction through a metallic material, such as copper, reduces the speed of signal propagation through copper conductors. For instance, impurities within the conductor can increase scattering of charge carriers and thereby increase the resistance within the conductor. The speed at which signals can be communicated through the conductor can be reduced by increased scattering (i.e., resistance). The physical geometry of the conductor can also effect scattering. For instance, scattering can also occur as a result of charge carriers reflecting off side walls of a conductor. As a cross section of a conductor decreases, the effect of side wall reflection (i.e., scatter) increases. Consequently, the electrical resistance of the conductor can increase as the cross-sectional area of a conductor decreases. Accordingly, increased scattering can result in reduced signal transmission speed. Signal transmission speed can be increased by driving the signal with increased power; however, this can result in higher power consumption of the electronic package and excess thermal energy production. In some instances, increasing the signal power may not result in increased signal transmission speed as scattering can become the dominant factor in the speed of signal transmission.

As bandwidth requirements of electronic packages increase, increased speed of processors, memory, and other dies is desired. Incorporating multiple dies in a single package can provide increased processing speed; however, increasing the speed of signal transmission between dies within the electronic package is desirable. The pitch of metallic conductors for routing signals is desired for reducing the size of electronic packages; however, reducing the cross section of the conductors can reduce the speed of signal transmission as previously described.

The present subject matter can provide a solution to this problem, such as by providing an interconnect bridge configured to include a high electron mobility channel (ballistic conduction channel), such as a two-dimensional electron gas (2DEG). In an example, the interconnect bridge can include a base element having a first material, such as silicon. The base element can be attachable to a substrate, for instance, a glass-cloth, ceramic, or other substrate. The substrate can be configured to support a first die and a second die. For instance, the first die or the second die can be attached to the interconnect bridge or the substrate supporting the interconnect bridge. A first layer semiconductive layer) can be attached to the base element. In an example, the first layer can include a second material having a first lattice parameter (e.g., lattice structure or lattice constant). A second layer (e.g., semiconductive layer) can be disposed on the first layer. The second layer can include a third material having a second lattice parameter. In some examples, the first, second, or third materials can be epitaxial materials. For instance, the first layer can be epitaxially grown on the base element and the second layer can be epitaxially grown on the first layer. A high electron mobility channel (ballistic conduction channel) can be formed between the first layer and the second layer based on a difference between the first lattice parameter and the second lattice parameter. In an example the heterojunction can be provided by the different lattice parameters of the second material and the third material. For instance, the high electron mobility channel can be based on a piezo electric characteristic of the second material or the third material. The different lattice parameters can strain the second material or the third material and correspondingly cause electrons to form the high electron mobility channel based on the piezo electric characteristic. In various examples, the high electron mobility channel can include a two-dimensional electron gas (2DEG) located between the first layer and the second layer. For instance, the 2DEG can be based on the heterojunction between the first layer and the second layer.

A first contact can be disposed in a first side of the 2DEG. The first contact can be adapted to electrically couple to the first die. At a distance from the location of the first contact, a second contact can be disposed in a second side of the 2DEG. The second contact can be adapted to electrically couple to the second die. Accordingly, an electrical signal can be transmitted from the first die (via the first contact) to the second die (via the second contact) through the 2DEG. The 2DEG can transmit the electrical signals by ballistic conduction (e.g., with reduced scattering). One or more ballistic conduction channels can be produced with a fine pitch (e.g., less than 50 nm), such as by molecular beam epitaxy, therefore increasing the density or number of routing layers between the dies.

In an example, the interconnect bridge can be configured as a high electron mobility transistor (HEMT). For instance, a third contact can be disposed in the 2DEG at a location between the first contact and the second contact. In an example, the third contact can be a gate of the HEMT. Accordingly, signal transmission through the ballistic conduction channel can be turned on, off, or modulated corresponding to a positive or negative charge applied to the third contact.

FIG. 1 illustrates an example of a cross section of an electronic package 100 including an interconnect bridge 102, according to an embodiment. The electronic package 100 can include a substrate 104, a first die 106, a second die 108, and the interconnect bridge 102. The interconnect bridge 102 can be coupled to the substrate 104. For instance, the interconnect bridge 102 can be located on, or embedded in, the substrate 104. As shown in the example of FIG. 1, the interconnect bridge 102 is disposed between one or more layers of the substrate 104. The interconnect bridge 102 can electrically couple the first die 106 and the second die 108. For instance, an electrical contact of the first die 106, such as a first die contact 114, can be electrically coupled to a first contact, such as a first contact 110, of the interconnect bridge 102. A second contact, such as a second contact 112, of the interconnect bridge 102 can be electrically coupled to an electrical contact of the second die 108, such as a second die contact 116. The interconnect bridge 102 can include a two-dimensional electron gas (2DEG) in electrical communication between the first contact 110 and the second contact 112. Accordingly, the first die 106 can be communicatively coupled to the second die 108. For instance, the first die 106 can transceive electrical signals with the second die 108. In an example, the dies, such as the first die 106 or the second die 108, can be tested for defects or quality separately before the dies are electrically coupled. Therefore, processors from different manufacturers (or locations) can be electrically coupled with increased reliability, reduced cost, different specifications, or enhanced features.

The substrate 104 can be electrically coupled to an electronic device through at least one electrical contact, such as a solder bump. For instance, the electronic device can be electrically coupled to a die, such as the first die 106 or the second die 108, through one or more routing layers communicatively coupled between the electrical contact of the electronic package 100 and at least one die. Accordingly, the electronic package 100 can be operatively coupled to the electronic device for performing logic or memory operations.

The die, such as the first die 106 or the second die 108 can include any memory or logic package. For instance, the die can include a silicon chip configured as a memory or logic circuit, such as a processor, flash memory, random access memory, central processing unit, graphics processing unit, or the like. The first die 106 and the second die 108 can communicate through the interconnect bridge 102 to perform memory or logic operations according to instructions of one or more of the dies or the electronic device. In an example, the first die 106 can be a different type of memory or logic package from the second die 108.

The substrate 104 can provide mechanical support to the die, such as die 106 or die 108, and one or more electrical routing layers (e.g., conductive layers 118) for electrical communication between the die and the electronic device. In various examples, the substrate can include one or more conductive layers 118 disposed on one or more dielectric layers 120. For instance, in the example of FIG. 1, the substrate 104 can include a plurality of alternating conductive layers 118 (routing layers) and dielectric layers 120. In a further example, the substrate 104 can include a single sided, double sided, or multi-layer construction (e.g., multiple layers of alternating dielectric layers 120 and conductive layers 118).

The dielectric layer 120 can be fabricated from materials including, but not limited to, FR-4, prepreg, ceramic, epoxy, other glass or fiber filled resin, polyimide, polyester, polyether ether ketone (PEEK), or the like. Accordingly, the substrate 104 can provide mechanical support for the die, electrical contacts, and routing layers, support for the interconnect bridge 102, or the like. In an example, for mechanical support, the substrate 104 can include a core including, but not limited to, a ceramic core.

The conductive layer 118 can be constructed from a material, including but not limited to copper, graphite, nickel, silver, gold, or the like. The conductive layer can be formed into one or more electronic circuits routing layers) on the substrate 104. For instance, the conductive layer 118 can be deposited on the dielectric layer 120 to form the electronic circuits. In other examples, the conductive layer 118 can be a conductive sheet attached to the dielectric layer 120. The conductive sheet can be etched to form the electronic circuit. Accordingly, the conductive layer 118 of the substrate 104 can provide circuit routing, grounding, thermal energy distribution, electromagnetic shielding, or the like.

As previously mentioned, the interconnect bridge 102 can include a ballistic conduction channel 121, such as the 2DEG for transceiving electrical signals between dies of the electronic package 100. For instance, electrical signals can be communicated between the first die 106 and the second die 108 through the ballistic conduction channel 121. The interconnect bridge 102 can include a heterojunction between a first layer 124 and a second layer 126. Accordingly, the ballistic conduction channel (2DEG) can be located between the first layer 124 and the second layer 126 based on the heterojunction. In various examples, the interconnect bridge 102 can include a plurality of ballistic conduction channels communicatively coupling different electrical contacts of two or more dies, such as the first die 106 or the second die 108.

In the example of FIG. 1, the interconnect bridge 102 can include a base element 122, the first layer 124, and the second layer 126. The first layer 124 can be disposed on (e.g., attached to) the base element 122, and the second layer 126 can be disposed on (e.g., attached to) the first layer 124. For instance, the base element 122 can be constructed from a material, such as a first material. The first layer 124 can include a second material, and the second layer 126 can include a third material. The second and third materials can be epitaxially formed materials including, but not limited to, silicon, sapphire, gallium nitride (GaN), aluminum gallium indium phosphide (AlGaInP), gallium arsenide (GaAs), diamond, iridium, aluminum gallium nitride (AlGaN), aluminum gallium arsenic (AlGaAs), aluminum oxide (Al2O3), graphene, zinc oxide (ZnO), zinc magnesium oxide (ZnMgO), lanthanum aluminate (LaAlO3), strontium titanate (SrTiO3), or other combinations of materials forming a heterojunction. In a further example, one or more ballistic conduction channels can be produced with a fine pitch (e.g., less than 50 nm), such as by molecular beam epitaxy, therefore increasing the density or number of routing layers between the dies. The plurality of ballistic conduction channels can be electrically isolated from one another, for instance, by base element 122.

One or more of the first, second, or third materials can be semiconductive materials. For instance, the first, second, and third material can be electrically resistive, but can be altered by various techniques to be conductive. In some examples, a portion or specific region of the semiconductive material can be altered to be conductive while the remaining portion of the semiconductive material is more resistive. In various examples, the first, second, and third materials can include different lattice parameters, such as different lattice structures or lattice polarizations. Each of the first, second, or third materials can include lattice parameters, such as a lattice structure, length of a unit cell along any of the primary axis, a band gap, a lattice constant, or the like.

As previously mentioned, a heterojunction can be formed based on the first layer 124 and the second layer 126. For instance, the first layer 124 can include a lattice parameter, such as a first lattice parameter. The second layer 126 can include a different lattice parameter, such as a second lattice parameter. Disposing the first layer 124 on the second layer 126 can induce a strain in the first layer 124 or the second layer 126. For instance, the first layer (second material) can include a different band gap than the second layer (third material) corresponding to the first lattice parameter and the second lattice parameter respectively. The first layer 124 or the second layer 126 can be a piezo electric material. The strain in the first layer 124 or the second layer 126 can alter the band gap between a valance band and a conduction band of the material (e.g., the second material, third material, or both). Accordingly, a quantum well can be located at the junction between the first layer 124 and the second layer 126 where electrons are accumulated in a substantially planar region along a surface of the first layer 124, a surface of the second layer 126, or anywhere therebetween. Correspondingly, the high electron mobility channel (e.g., 2DEG) can be formed between the first layer 124 and the second layer 126. Ballistic conduction can be achieved though the high electron mobility channel (e.g., 2DEG) based on the number of charge carriers within the high electron mobility channel and an unobstructed path for transport of charge carriers (e.g., electrons) between the first contact 110 and the second contact 112. In other words, because of the highly uniform lattice structure of the second and third materials and the existence of the high electron mobility channel between the first layer 124 and the second layer 126, the charge carriers can be transported from the first contact 110 to the second contact 112 according substantially to Newton's second law of motion at non-relativistic speeds.

In an example, the second material can be GaN. The third material attached to the second material can be AlGaN. In a further example, the second material can be GaAs and the third material can be AlGaAs. The second material can be compatible with the third material (e.g., can be epitaxially grown on the second material). As previously described, the second material and the third material can have different lattice parameters to provide the high electron mobility channel (e.g. 2DEG) between the first layer 124 and the second layer 126. In an example, the second material (GaN) or the third material (ALGaN) can be doped with impurities (e.g., different atoms) to increase the number of electrons or holes with the material. For instance, the second material (GaN) can be doped to include donor electrons to form a n-type material. The donor electrons can migrate to a location in the third material (e.g., un-doped ALGaN) based on the characteristics of the heterojunction. In some examples, the second material, the third material, or both can be doped using a modulation doping technique to separate the impurities of the material from the electrons. Accordingly, the ballistic conduction channel, such as ballistic conduction channel 121 can be free of the impurities and correspondingly scattering can be reduced.

In an example, a passivation layer 128 can be disposed between the second material (first layer 124) and the first material (base element 122). In some examples, the second material may include an incompatible lattice structure with the first material. The passivation layer 128 can include a material that is compatible with both the first material and the second material. Accordingly, the passivation layer 128 can be epitaxially grown on the base element 122, and the first layer 124 can be epitaxially grown on the passivation layer 128.

The contact, such as the first contact 110 and the second contact 112, can be a conductive interconnect between the interconnect bridge 102 and one or more dies, such as the die 106 or the die 108. For instance, the first contact 110 can be electrically coupled to the first die 106, and the second contact 112 can be electrically coupled to the second die 108. In some examples, the contact can be a routing layer, via, solder pad, or the like. The contact can be constructed from a conductive material including, but not limited to, copper, silver, gold, graphite, or the like. The contact can be disposed in the ballistic conduction channel (2DEG). For instance, the first contact 110 can be disposed in the 2DEG at a distance d from the second contact 112. Accordingly, the first die 106 can be in electrical communication with the second die 108 through the first contact 110, across the ballistic conduction channel, and through the second contact 112.

As shown in the example of FIG. 1, a layer of base material 130, such as the first material, can be disposed on the second layer 126. In an example the base material 130 can insulate the second layer 126, for instance, from impurities. The contacts, such as the first contact 110 and the second contact 112 can be extended through the base material 130 to electrically couple with the first die 106 and second die 108 respectively.

Figure 2:
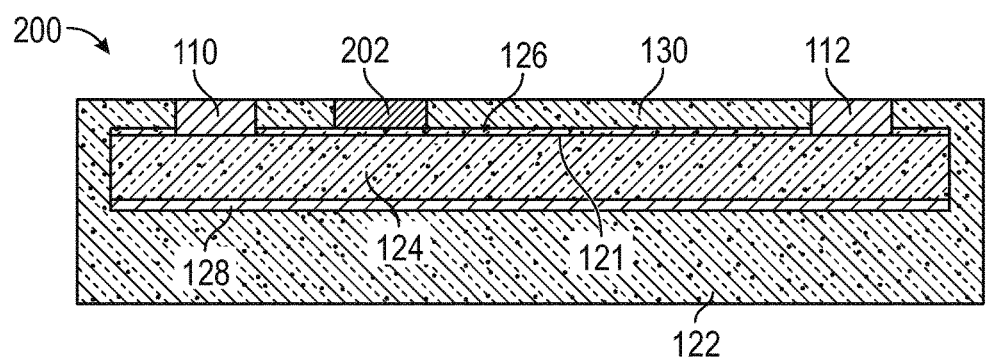
FIG. 2 is a cross section of an example of an interconnect bridge including a gate, according to an embodiment.

FIG. 2 depicts a cross is section of an interconnect bridge 200 including a gate, according to an embodiment. For instance, the interconnect bridge 200 can include the base element 122, the first layer 124, the second layer 126, the first contact 110, and the second contact 112, as previously described with regard to the interconnect bridge 102. In the example of FIG. 2, the interconnect bridge 200 can optionally include a third contact 202 (e.g., gate). Accordingly, the interconnect bridge 200 can be configured as a transistor, such as a high-electron-mobility transistor (HEMT). The third contact 202 can be driven with a negative potential that switches off the interconnect (e.g., ballistic conduction channel between the first die 106 and the second die 108). For instance, the interconnect bridge 200 can operate as a depletion mode field effect transistor (FET) or HEMT. In an example, the ballistic conduction channel can be normally on. Thus, power signals or data signals can be gated to reduce power consumption of the electronic package, such as the electronic package 100 (e.g., of the first die 106, the second die 108, or both). In further examples, the ballistic conduction channel can be normally off.

In some examples, the communication between the first die 106 and the second die 108 can be controlled by the first die 106, second die 108, or other logic circuit. For instance, the first die 106 and second die 108 can be configured as master-slave relationship. The master can control the gate (third contact 202). For instance, a CPU can be the master driving the gate and can be coupled to a GPU configured as the slave. In a further example, where there are two CPU cores, each one of the cores can take turns controlling the gate. In an example, two gates can be included along the ballistic conduction channel (one connected to each die). Accordingly, the electrical communication between the first die and the second die can be switched on or off.

In some examples, electrical communication through one or more ballistic conduction channels can be switched on or off to perform various operations. For instance, the power or data signals can be gated to reduce power consumption of the electronic package 200. Power signals can be amplified or metered based on the switching of the ballistic conduction channel. In a further example, power or data signals can be modulated to transmit data between dies. For instance, data or power can be manipulated to communicate multiple data parameters simultaneously. In an example, at least one die, such as the first die 106 or the second die 108 can control the third contact 202 (gate) to perform current modulation, voltage modulation, sequence modulation, or the like. In a further example, any combination of current modulation, voltage modulation, sequence modulation, or other type of modulation can be performed. The modulation can be used for encryption of communications with one or more of the dies or between dies within the electronic package 200. For instance, the encryption can be based on a key. Where dies are produced by different vendors, encryption can prevent scanning and decoding of the dies. Accordingly, protection against reverse engineering can be provided or data stored on the die can be protected.

Figure 3:
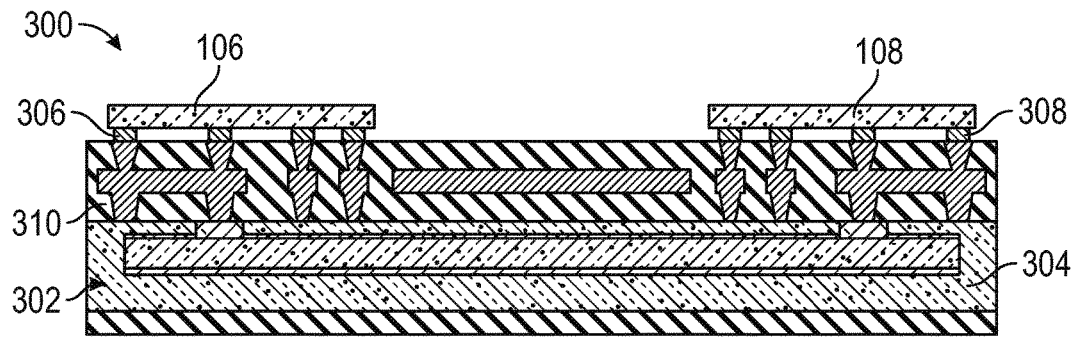
FIG. 3 illustrates an example of an interconnect bridge including a base element supporting a first die and a second die, according to an embodiment.

FIG. 3 illustrates an example of an electronic package 300 including an interconnect bridge 302 with a base element 304 supporting a first die (e.g., first die 106) and a second die (e.g., second die 108), according to an embodiment. For instance, in the example of FIG. 3, the base element 304 can extend under the first die 106 and the second die 108. For instance, the interconnect bridge 302 can extend under a plurality of first die contacts 306 and a plurality of second die contacts 308. In a further example, the first die 106 and the second die 108 can be attached under the base layer. Accordingly, the first die 106 and the second die 108 can be supported by the interconnect bridge 300. The interconnect bridge 300 can be supported by the substrate 310, as shown in the example of FIG. 3.

Figure 4:
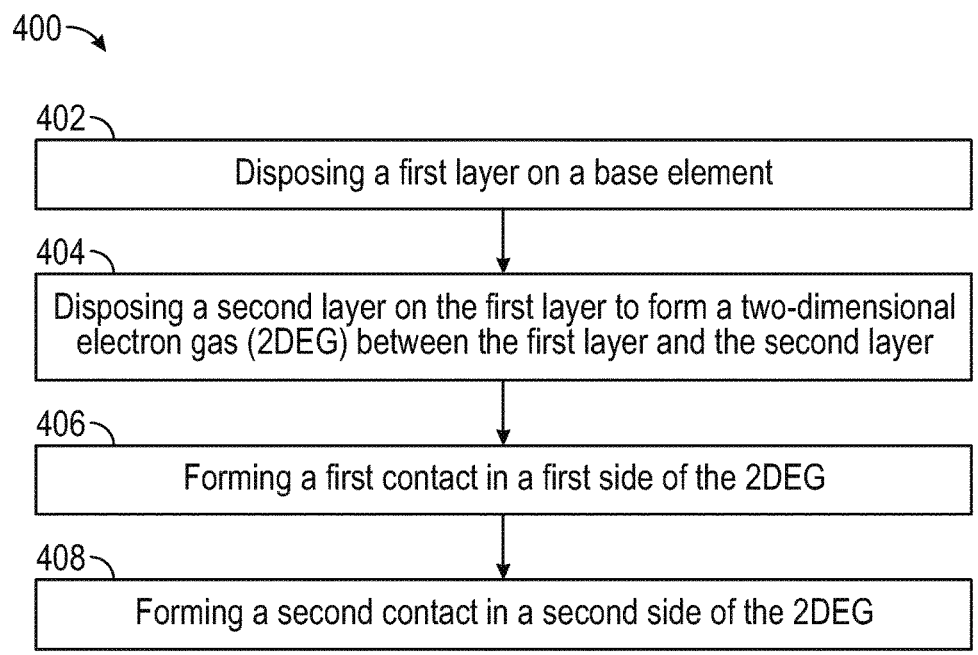
FIG. 4 depicts an example of a technique for communicatively coupling a first die to a second die with an interconnect bridge, according to an embodiment.

FIG. 4 depicts an example of a method 400 of a technique for communicatively coupling a first die to a second die with an interconnect bridge, such as the interconnect bridge 102, 200, or 300, as previously described herein. In describing the method 400, reference is made to one or more components, features, functions, and processes previously described herein. Where convenient, reference is made to the components, features, processes and the like with reference numerals. Reference numerals provided are exemplary and are nonexclusive. For instance, features, components, functions, processes, and the like described in the method 400 include, but are not limited to, the corresponding numbered elements provided herein. Other corresponding features described herein (both numbered and unnumbered) as well as their equivalents are also considered.

At 402, a first layer (e.g., first layer 124) can be disposed on a base element, such as base element 122, as previously described herein. The base element can be a first material, and the first layer can be a second material different from the first material. For instance, the second material can be disposed on the first material by molecular beam epitaxy, physical vapor deposition, chemical vapor deposition, or the like. In an example, the first material can be silicon, such as a silicon wafer (e.g., crystalline silicon) or aluminum oxide (Al2O3). In a further example, the second material can be GaN or GaAs. The second material can be compatible (e.g., includes a compatible lattice parameter) with the first material, for example, to dispose the second material on the first material by epitaxy. In an example where the first material and the second material are incompatible, a passivation layer, such as passivation layer 128, can be disposed on the base element, and the second material can be disposed on the passivation layer. The passivation layer can be compatible with both the first material and the second material, so the second material to be attached to the first material. In a further example, the base element can be attached to a substrate of an electronic package, such as the substrate 104. Accordingly, the base element can support the first die and the second die. Correspondingly, the substrate can support the base element. The substrate can include one or more electrical routing layers (e.g., conductive layers 118) communicatively coupled to the first die, the second die, the interconnect bridge, or other element of the electronic package.

At 404, a second layer, such as second layer 126, can be disposed on the first layer. The second layer can include a third material different from the second material, as previously described. For instance, where the first layer includes a second material of at least one of GaN and GaAs, the third material can include at least one of AlGaN and AlGaAs. The second material, third material, or both can be a semiconductive material, such as different semiconductive materials. A lattice parameter of the second material can be different from a lattice parameter of the third material. As previously described, a high electron mobility channel (e.g., 2DEG) can be formed between the first layer and the second layer. In an example, a heterojunction can be formed based on the first layer and the second layer to form the high electron mobility channel. The high electron mobility channel can be based on the first lattice parameter being different than the second lattice parameter. In some examples, the second material or the third material can be a piezo electric material. The strain in the piezo electric material can increase the number of electrons in the conduction band of the piezo electric material. In an example, a stress in the piezo electric material can cause electrons from the piezo electric material (e.g., GaN) to migrate towards the third material (e.g., AlGaN). In further examples, the 2DEG can be formed by doping at least one of the first layer and the second layer with a plurality of charge carriers. For instance, the first layer or the second layer can be doped with atoms to increase the number of electrons or holes within the first or second layers respectively. In an example, the first layer or the second layer can include an atomically thin material, such as graphene, to form the 2DEG between the first layer and the second layer.

At 406, a first contact, such as first contact 110, can be formed in a first side of the 2DEG. For instance, an electrically conductive material can be disposed (e.g., metalized) on the first layer or the second layer to electrically couple the first contact to the first die. For instance, the first contact can be located through the second layer and be disposed on the first layer. In various examples, the first contact can be formed by a process including, but not limited to, electroplating, physical vapor deposition, chemical vapor deposition, sputtering, or the like. The first contact can be electrically coupled directly to a first die contact, such as first die contact 124 or first die contact 306, through one or more routing layers.

At 408, a second contact, such as the second contact 112, can be formed in a second side of the 2DEG. The second contact can be formed by one of the processes described above for forming the first contact. The second contact can be electrically coupled to the second die directly (e.g., to the second die contact) or through one or more electrical routing layers. The second contact can be formed at a distance from the first contact. For instance, the first contact can be formed on a first side, end, or portion of the ballistic conduction channel, and the second contact can be formed on a second side, end, or portion of the ballistic conduction channel. Accordingly, the first die and the second die can be communicatively coupled at a distance through the ballistic conduction channel, such as through the 2DEG.

In a further example, a third contact can be formed in the 2DEG between the first contact and the second contact. For instance, the third contact can be constructed from a process as previously described with regard to the first contact or the second contact. The third contact can be a gate (e.g., field-effect transistor gate) as previously described. The third contact can be electrically coupled to at least one of the first die and the second die. For instance, the third contact can be electrically coupled to the first die or the second die through one or more routing layers. Where the third contact is configured as a field-effect transistor gate, the third contact can be configured to switch the ballistic conduction channel on or off. In a further example, the third contact can be used to modulate the electrical transmission (e.g., signal or power) communicated through the ballistic conduction channel as previously described.

A base material, such as base material 130, can be disposed on the second layer. In an example, the base material can be epitaxially formed on the second material. The base material can be constructed for silicon, as described with regard to the base element. In some examples, the base material can cover the one or more contacts, such as the first, second, or third contact. Accordingly, the base material can be ground down (e.g., polished) to expose the contacts through the base material or to level the contacts to be substantially coplanar with the base material.

Figure 5:
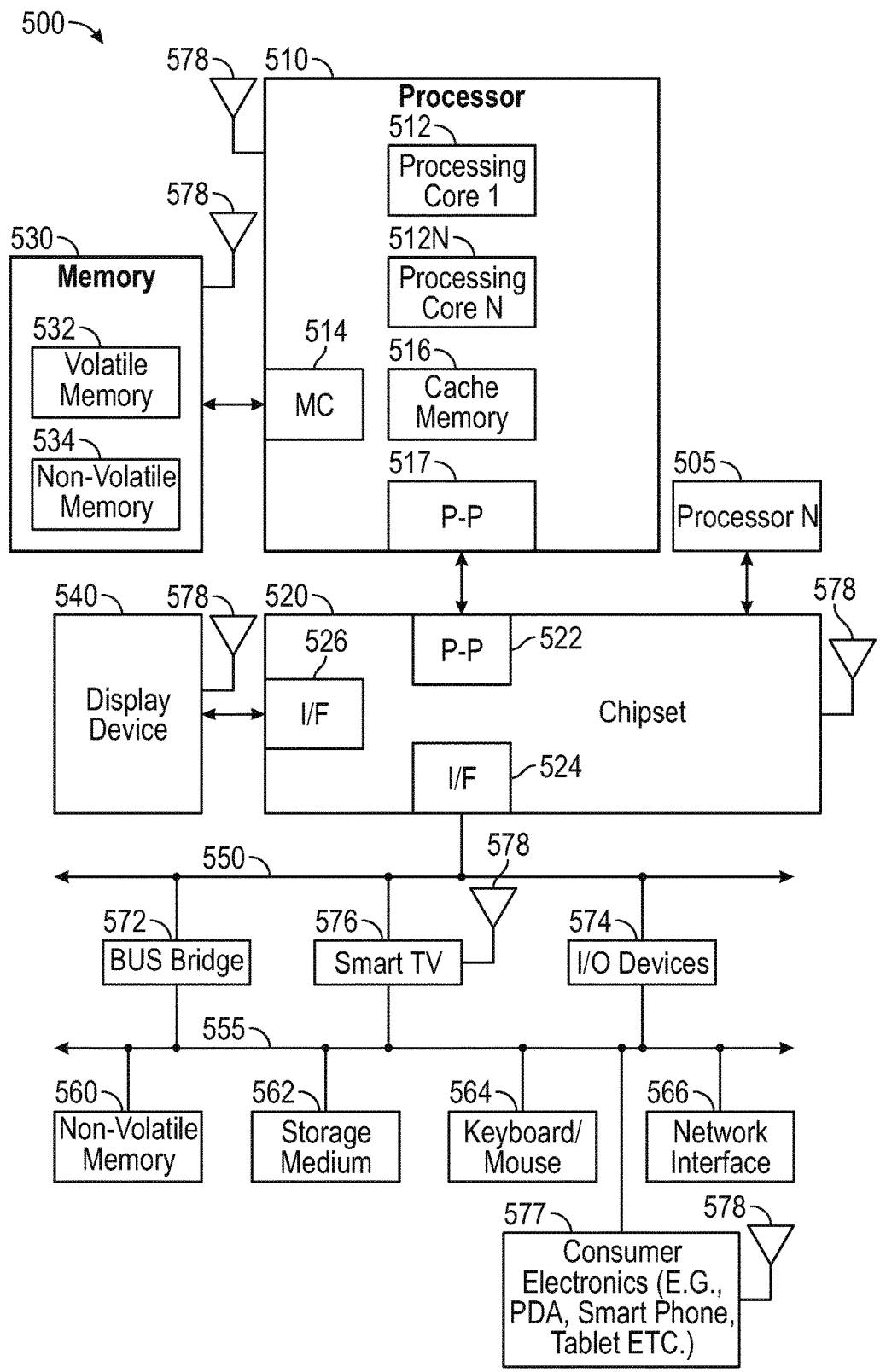
FIG. 5 illustrates a system level diagram in accordance with some embodiments of the invention.

FIG. 5 illustrates a system level diagram, according to an embodiment of the invention. For instance, FIG. 5 depicts an example of an electronic device (e.g., system) including an interconnect bridge having a ballistic conduction channel, as described in the present disclosure. FIG. 5 is included to show an example of a higher-level device application for the present invention. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processing cores 512 and 512N, where 512N represents the Nth processor core inside processor 510 where N is a positive integer. For instance, the processing core 512 or processing core 512N can include the first die 414 or the second die 124, as previously described herein. In one embodiment, system 500 includes multiple processors including 510 and 505, where processor 505 has logic similar or identical to the logic of processor 510. In an example, the processor 510 can include the interconnect bridge, such as interconnect bridge 100, 200, or 300. For instance, the processing core 512 can be communicatively coupled to one or more processing cores 512N through the ballistic conduction channel of the interconnect bridge. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. In an example, the memory 530 can include the electronic package 100. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices 572, 576, 574, 560, 562, 564, 565, 577, etc. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520, via interface 524, couples with a non-volatile memory 560, a mass storage device(s) 562, a keyboard/mouse 564, a network interface 566, smart TV 576, consumer electronics 577, etc.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

Various Notes & Examples

Each of these non-limiting examples may stand on its own, or may be combined in various permutations or combinations with one or more of the other examples. To better illustrate the method and apparatuses disclosed herein, a non-limiting list of embodiments is provided here:

Example 1 is an interconnect bridge for communicatively coupling two or more dies of an electronic package, the interconnect bridge comprising: a base element including a first material, wherein the base element is attachable to a substrate configured to support a first die and a second die; a first layer attached to the base element, wherein the first layer includes a second material; a second layer disposed on the first layer, wherein the second layer includes a third material; a two-dimensional electron gas (2DEG) located between the first layer and the second layer; a first contact disposed in a first side of the 2DEG, the first contact adapted to electrically couple to the first die; and a second contact disposed in a second side of the 2DEG at a distance from the first contact, the second contact adapted to electrically couple to the second die, wherein the first contact is electrically coupled to the second contact through the 2DEG.

In Example 2, the subject matter of Example 1 optionally includes wherein the second material includes a first lattice parameter and the third material includes a second lattice parameter, and the 2DEG is formed by a heterojunction between the first layer and the second layer based on the first lattice parameter being different than the second lattice parameter.

In Example 3, the subject matter of any one or more of Examples 1-2 optionally include wherein the second material and the third material are semiconductive materials.

In Example 4, the subject matter of any one or more of Examples 1-3 optionally include wherein the base element supports the first die and the second die, and the substrate supports the base element.

In Example 5, the subject matter of any one or more of Examples 1-4 optionally include wherein the first, second, and third materials are epitaxial materials.

In Example 6, the subject matter of any one or more of Examples 1-5 optionally include wherein at least one of the first and second layers are doped with a plurality of charge carriers.

In Example 7, the subject matter of any one or more of Examples 1-6 optionally include wherein the first layer is constructed of at least one of GaN and GaAs.

In Example 8, the subject matter of any one or more of Examples 1-7 optionally include wherein the second layer is constructed of at least one of AlGaN and AlGaAs.

In Example 9, the subject matter of any one or more of Examples 1-8 optionally include a third contact disposed in the 2DEG between the first contact and the second contact, wherein the third contact is configured as a field-effect transistor gate.

In Example 10, the subject matter of Example 9 optionally includes wherein the gate is to be in electrical communication with at, least, one of the first die and the second die.

In Example 11, the subject matter of any one or more of Examples 1-10 optionally include wherein the base element is attached to a substrate of an electronic package.

Example 12 is a method of communicatively coupling a first die to a second die with an interconnect bridge, the method comprising: disposing a first layer on a base element, wherein the base element is a first material and the first layer is a second material different from the first material; disposing a second layer on the first layer, wherein the second layer includes a third material different from the second material, and a lattice parameter of the second material is different from a lattice parameter of the third material to form a two-dimensional electron gas (2DEG) between the first layer and the second layer; forming a first contact in a first side of the 2DEG, the first contact adapted to be electrically coupled to a first die; and forming a second contact in a second side of the 2DEG, the second contact adapted to be electrically coupled to a second die.

In Example 13, the subject matter of Example 12 optionally includes forming a heterojunction between the first layer and the second layer to form the 2DEG based on the first lattice parameter being different than the second lattice parameter.

In Example 14, the subject matter of any one or more of Examples 12-13 optionally include wherein disposing the first layer on the base element includes disposing a semiconductive material on the base element, and disposing the second layer on the first layer includes disposing a different semiconductive material on the first layer.

In Example 15, the subject matter of any one or more of Examples 12-14 optionally include attaching the base element to a substrate of an electronic package, wherein the base element supports the first die and the second die, and the substrate supports the base element.

In Example 16, the subject matter of any one or more of Examples 12-15 optionally include wherein disposing the first layer on the base element includes disposing an epitaxial material on the base element, and disposing the second layer on the first layer includes disposing a different epitaxial material on the first layer.

In Example 17, the subject matter of any one or more of Examples 12-16 optionally include doping at least one of the first layer and the second layer with a plurality of charge carriers.

In Example 18, the subject matter of any one or more of Examples 12-17 optionally include wherein disposing the first layer on the base element includes disposing at least one of GaN and GaAs on the base element.

In Example 19, the subject matter of any one or more of Examples 12-18 optionally include wherein disposing the second layer on the first layer includes disposing at least one of AlGaN and AlGaAs on the first layer.

In Example 20, the subject matter of any one or more of Examples 12-19 optionally include forming a third contact in the 2DEG between the first contact and the second contact, wherein the third contact is configured as a field-effect transistor gate.

In Example 21, the subject matter of Example 20 optionally includes electrically coupling the gate with at least one of the first die or the second die.

Example 22 is an interconnect bridge constructed from any one of the method Examples 12-21 for communicatively coupling two or more dies.

Example 23 is an electronic package including a first die and a second die attached to a substrate and an interconnect bridge constructed from any one of the method Examples 12-22.

In Example 24, the subject matter of Example 23 optionally includes wherein the base element is attached to a substrate of the electronic package.

Example 25 is an electronic package including an interconnect bridge for communication between a first die and a second die of the electronic package, the electronic package comprising: a first die and a second die attached to a substrate; and an interconnect bridge electrically coupling the first die to the second die, the interconnect bridge including: a base element including a first material, wherein the base element is attachable to the substrate, a first layer attached to the base element, wherein the first layer includes a second material, a second layer disposed on the first layer, wherein the second layer includes a third material, a two-dimensional electron gas (2DEG) located between the first layer and the second layer, a first contact disposed in a first side of the 2DEG, the first contact adapted to electrically couple to the first die, and a second contact disposed in a second side of the 2DEG, the second contact adapted to electrically couple to the second die, wherein the first contact is located at a distance from the second contact.

In Example 26, the subject matter of Example 25 optionally includes wherein the second material includes a first lattice parameter and the third material includes a second lattice parameter, and the 2DEG is formed by a heterojunction between the first layer and the second layer based on the first lattice parameter being different than the second lattice parameter.

In Example 27, the subject matter of any one or more of Examples 25-26 optionally include wherein the second material and the third material are semiconductive materials.

In Example 28, the subject matter of any one or more of Examples 25-27 optionally include wherein the base element supports the first die and the second die, and the substrate supports the base element.

In Example 29, the subject matter of any one or more of Examples 25-28 optionally include wherein the first, second, and third materials are epitaxial materials.

In Example 30, the subject matter of any one or more of Examples 25-29 optionally include wherein at least one of the first and second layers are doped with a plurality of charge carriers.

In Example 31, the subject matter of any one or more of Examples 25-30 optionally include wherein the first layer is constructed of at least one of GaN and GaAs.

In Example 32, the subject matter of any one or more of Examples 25-31 optionally include wherein the second layer is constructed of at least one of AlGaN and AlGaAs.

In Example 33, the subject matter of any one or more of Examples 25-32 optionally include a third contact disposed in the 2DEG between the first contact and the second contact, wherein the third contact is configured as a field-effect transistor gate.

In Example 34, the subject matter of any one or more of Examples 25-33 optionally include wherein the gate is to be in electrical communication with at least one of the first die and the second die.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An interconnect bridge for communicatively coupling two or more dies of an electronic package, the interconnect bridge comprising:
   a base element including a first material, wherein the base element is attachable to a substrate configured to support a first die and a second die;
   a first layer attached to the base element, wherein the first layer includes a second material;
   a second layer disposed on the first layer, wherein the second layer includes a third material;
   a two-dimensional electron gas (2DEG) located between the first layer and the second layer;
   a first contact disposed on the first layer, extending through the second layer, and in the 2DEG, the first contact adapted to electrically couple to the first die; and
   a second contact disposed on the first layer, extending through the second layer, and in the 2DEG at a distance from the first contact, the second contact adapted to electrically couple to the second die, wherein the first contact is electrically coupled to the second contact through the 2DEG.

2. The interconnect bridge of claim 1, wherein the second material includes a first lattice parameter and the third material includes a second lattice parameter, and the 2DEG is formed by a heterojunction between the first layer and the second layer based on the first lattice parameter being different than the second lattice parameter.

3. The interconnect bridge of claim 1, wherein the second material and the third material are semiconductive materials.

4. The interconnect bridge of claim 1, wherein the first, second, and third materials are epitaxial materials.

5. The interconnect bridge of claim 1, wherein at least one of the first and second layers are doped with a plurality of charge carriers.

6. The interconnect bridge of claim 1, wherein the first layer is constructed of at least one of GaN and GaAs.

7. The interconnect bridge of claim 1, wherein the second layer is constructed of at least one of AlGaN and AlGaAs.

8. The interconnect bridge of claim 1, further comprising a third contact disposed in the 2DEG between the first contact and the second contact, wherein the third contact is configured as a field-effect transistor gate.

9. The interconnect bridge of claim 8, wherein the gate is to be in electrical communication with at least one of the first die and the second die.

10. A method of communicatively coupling a first die to a second die with an interconnect bridge, the method comprising:
    disposing a first layer on a base element, wherein the base element is a first material and the first layer is a second material different from the first material;
    disposing a second layer on the first layer, wherein the second layer includes a third material different from the second material, and a lattice parameter of the second material is different from a lattice parameter of the third material to form a two-dimensional electron gas (2DEG) between the first layer and the second layer;
    forming a first contact on the first layer extending through the second layer, and in the 2DEG, the first contact adapted to be electrically coupled to a first die; and
    forming a second contact on the first layer, extending through the second layer, and in the 2DEG, the second contact adapted to be electrically coupled to a second die.

11. The method of claim 10, further comprising forming a heterojunction between the first layer and the second layer to form the 2DEG based on the first lattice parameter being different than the second lattice parameter.

12. The method of claim 10, wherein disposing the first layer on the base element includes disposing a semiconductive material on the base element, and disposing the second layer on the first layer includes disposing a different semiconductive material on the first layer.

13. The method of claim 10, wherein disposing the first layer on the base element includes disposing an epitaxial material on the base element, and disposing the second layer on the first layer includes disposing a different epitaxial material on the first layer.

14. The method of claim 10, further comprising doping at least one of the first layer and the second layer with a plurality of charge carriers.

15. The method of claim 10, wherein disposing the first layer on the base element includes disposing at least one of GaN and GaAs on the base element.

16. The method of claim 10, wherein disposing the second layer on the first layer includes disposing at least one of AlGaN and AlGaAs on the first layer.

17. The method of claim 10, further comprising forming a third contact in the 2DEG between the first contact and the second contact, wherein the third contact is configured as a field-effect transistor gate.

18. The method of claim 17, further comprising electrically coupling the gate with at least one of the first die or the second die.

19. An electronic package including an interconnect bridge for communication between a first die and a second die of the electronic package, the electronic package comprising:
    a first die and a second die attached to a substrate; and
    an interconnect bridge electrically coupling the first die to the second die, the interconnect bridge including:
        a base element including a first material, wherein the base element s attachable to the substrate,
        a first layer attached to the base element, wherein the first layer includes a second material, a second layer disposed on the first layer, wherein the second layer includes a third material, a two-dimensional electron gas (2DEG) located between the first layer and the second layer, a first contact disposed on the first laver, extending through the second layer, and in the 2DEG, the first contact adapted to electrically couple to the first die, and a second contact disposed on the first layer, extending through the second layer, and in the 2DEG, the second contact adapted to electrically couple to the second die, wherein the first contact is located at a distance from the second contact.

20. The electronic package of claim 19, wherein the second material includes a first lattice parameter and the third material includes a second lattice parameter, and the 2DEG is formed by a heterojunction between the first layer and the second layer based on the first lattice parameter being different than the second lattice parameter.

21. The electronic package of claim 19, wherein the second material and the third material are semiconductive materials.

22. The electronic package of claim 19, wherein the first, second, and third materials are epitaxial materials.

23. The electronic package of claim 19, wherein at least one of the first and second layers are doped with a plurality of charge carriers.

24. The electronic package of claim 19, further comprising a third contact disposed in the 2DEG between the first contact and the second contact, wherein the third contact is configured as a field-effect transistor gate.

25. The electronic package of claim 19, wherein the gate is to be in electrical communication with at least one of the first die and the second die.

* * * * *

UNITED STATES PATENT AND TRADEMARK OFFICE
CERTIFICATE OF CORRECTION

PATENT NO. : 10,381,310 B2
APPLICATION NO. : 15/457102
DATED : August 13, 2019
INVENTOR(S) : Arvind Sundaram Page 1 of 1

It is certified that error appears in the above-identified patent and that said Letters Patent is hereby corrected as shown below:

In the Claims

In Column 15, Line 46, in Claim 1, delete "laver," and insert --layer,-- therefor In Column 16, Line 20, in Claim 10, delete "layer" and insert --layer,-- therefor In Column 16, Line 35, in Claim 12, delete "laver." and insert --layer.-- therefor In Column 16, Line 65, in Claim 19, delete "s" and insert --is-- therefor In Column 17, Line 5, in Claim 19, delete "laver," and insert --layer,-- therefor Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*